United States Patent
Link et al.

(10) Patent No.: US 10,746,816 B2
(45) Date of Patent: Aug. 18, 2020

(54) SYSTEM AND METHOD FOR REMOVING ENERGY FROM AN ELECTRICAL CHOKE

(71) Applicant: GENERAL ELECTRIC COMPANY, Schenectady, NY (US)

(72) Inventors: Douglas John Link, Lake Mills, WI (US); Scott Walterman, Waukesha, WI (US); Randy Hladilek, Waukesha, WI (US); Timothy Strait, Waukesha, WI (US); Margaret Wiza, New Berlin, WI (US); Melissa Freeman, Oconomowoc, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 182 days.

(21) Appl. No.: 15/888,207

(22) Filed: Feb. 5, 2018

(65) Prior Publication Data
US 2019/0242951 A1    Aug. 8, 2019

(51) Int. Cl.
*G01R 33/36* (2006.01)
*G01R 33/00* (2006.01)
*G01R 33/44* (2006.01)
*G01R 33/385* (2006.01)

(52) U.S. Cl.
CPC ....... *G01R 33/007* (2013.01); *G01R 33/3852* (2013.01); *G01R 33/44* (2013.01); *G01R 33/3685* (2013.01)

(58) Field of Classification Search
CPC ........ G01R 33/36; G01R 33/50; G01R 33/02; G01R 33/28; G01R 33/007; G01R 33/44

USPC .............. 324/173, 307, 309, 318, 322, 314, 324/207.15, 654, 76.75
See application file for complete search history.

(56) References Cited

U.S. PATENT DOCUMENTS

| | | | |
|---|---|---|---|
| 5,311,136 A * | 5/1994 | Takahashi | G01R 33/3852 324/318 |
| 5,315,982 A * | 5/1994 | Ward | H01F 38/12 123/598 |
| 6,121,857 A * | 9/2000 | Huang | H01F 17/045 333/172 |
| 6,984,979 B1 * | 1/2006 | Edel | G01R 15/185 324/253 |
| 8,441,825 B2 | 5/2013 | Zeng et al. | |
| 8,619,446 B2 | 12/2013 | Liu et al. | |
| 8,723,629 B1 * | 5/2014 | Liu | H01F 27/29 336/83 |
| 2005/0088256 A1 * | 4/2005 | Gottlieb | H01F 17/06 333/181 |
| 2008/0058913 A1 * | 3/2008 | Gray | A61N 1/05 607/116 |
| 2014/0329688 A1 * | 11/2014 | Aoki | G01R 33/3815 505/162 |

(Continued)

Primary Examiner — Jermele M Hollington
Assistant Examiner — Taqi R Nasir
(74) Attorney, Agent, or Firm — Grogan, Tuccillo & Vanderleeden, LLP

(57) ABSTRACT

A system for removing energy from an electrical choke is provided. The system includes one or more cores, at least one inductive coupling, and a resistor. The one or more cores are configured to form part of the electrical choke by generating magnetic energy. The at least one inductive coupling is operative to convert the magnetic energy into electrical energy. The resistor is electrically connected to the at least one inductive coupling and operative to dissipate the electrical energy as heat.

20 Claims, 8 Drawing Sheets

(56) References Cited

U.S. PATENT DOCUMENTS

2015/0103571 A1 4/2015 Zheng et al.
2016/0191010 A1* 6/2016 Freeman .................. H03H 7/06
333/177

* cited by examiner

SYSTEM AND METHOD FOR REMOVING ENERGY FROM AN ELECTRICAL CHOKE

BACKGROUND

Technical Field

Embodiments of the invention relate generally to electrical chokes and medical imaging systems, and more specifically, to a system and method for removing energy from an electrical choke.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses, also referred to hereinafter as the "MR signal," from the nuclei as the excited protons relax back to their lower energy normal state, a map or image of these nuclei responses as a function of their spatial location is generated and displayed. An image of the nuclei responses, also referred to hereinafter as an "MRI image" and/or simply "image," provides a non-invasive view of a subject's internal structure.

Many traditional MRI systems use gradient coils to generate gradient magnetic fields, which in turn, provide for the localization/spatial encoding of the atomic nuclei. The gradient coils are often driven by gradient amplifiers which are usually based on power switching electronic topologies/device, e.g., metal-oxide-semiconductor field-effect transistors ("MOSFETs") and/or Insulated Gated Bipolar Transistors ("IGBTs"). Many such electronic topologies/devices typically have fast switching edges requiring common mode filtering to improve the amperage output fidelity and system Electromagnetic Compatibility ("EMC") performance. Many common mode filters, e.g., electrical chokes, however, have ferrite cores which are susceptible to overheating when subjected to common mode currents, i.e., the higher and/or longer a common mode current flows through a ferrite core, the more heat generated in the ferrite core. While it is possible to lower the risk of a ferrite core overheating by increasing the size of the core, many devices using ferrite cores, e.g., gradient amplifiers, have limited space. In other words, it is usually impractical to improve the performance of a ferrite core by increasing its size. Moreover, many emerging MRI technologies require higher common mode currents and/or faster switching times than traditional ferrite cores can handle without significant risk of overheating.

What is needed, therefore, is an improved system and method for removing energy from an electrical choke.

BRIEF DESCRIPTION

In an embodiment, a system for removing energy from an electrical choke is provided. The system includes one or more cores, at least one inductive coupling, and a resistor. The one or more cores are configured to form part of the electrical choke by generating magnetic energy. The at least one inductive coupling is operative to convert the magnetic energy into electrical energy. The resistor is electrically connected to the at least one inductive coupling and operative to dissipate the electrical energy as heat.

In another embodiment, an electrical choke is provided. The electrical choke includes one or more cores, at least one inductive coupling, and a resistor. The one or more cores are operative to generate magnetic energy. The at least one inductive coupling is operative to convert the magnetic energy into electrical energy. The resistor is electrically connected to the at least one inductive coupling and operative to dissipate the electrical energy as heat.

In yet another embodiment, a method for removing energy from an electrical choke is provided. The method includes generating magnetic energy via one or more cores of the choke; converting the magnetic energy into electrical energy via at least one inductive coupling; and dissipating the electrical energy as heat via a resistor electrically connected to the at least one inductive coupling.

DRAWINGS

The present invention will be better understood from reading the following description of non-limiting embodiments, with reference to the attached drawings, wherein below:

DETAILED DESCRIPTION

Figure 1:
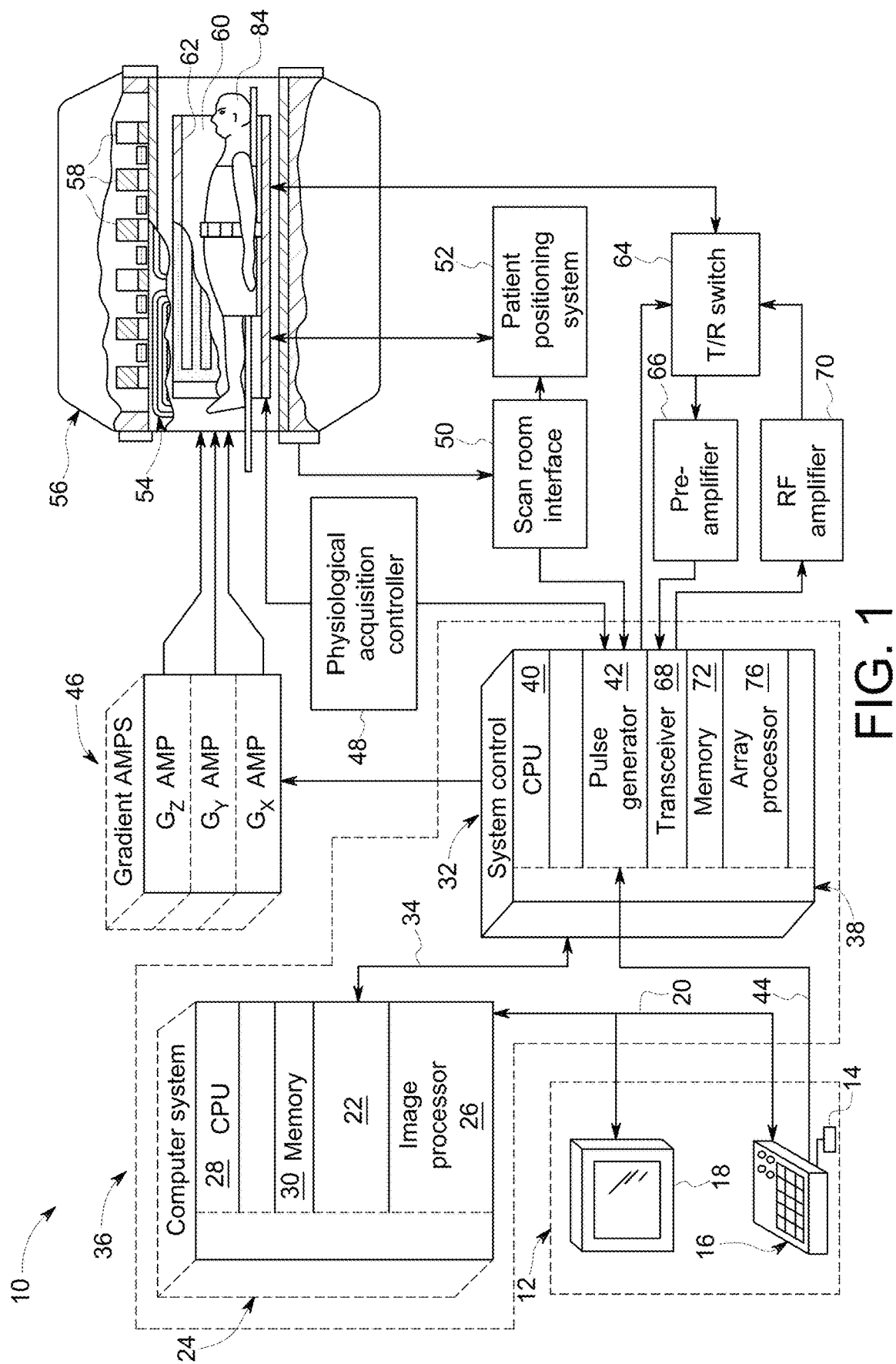
FIG. 1 is a block diagram of a magnetic resonance imaging system that includes a system for removing energy from an electrical choke, in accordance with an embodiment of the present invention.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "real-time," as used herein, means a level of processing responsiveness that a user senses as sufficiently immediate or that enables the processor to keep up with an external process. The term "MR data," as used herein, refers to data, e.g., raw K-Space and/or image space, derived from an MR signal.

Further, while the embodiments disclosed herein are described with respect to an MRI system, it is to be understood that embodiments of the present invention may be applicable to any device which utilize/includes an electrical choke. Further still, as will be appreciated, embodiments of the present invention related imaging systems may be used to analyze tissue generally and are not limited to human tissue.

Referring now to FIG. 1, the major components of an MRI system 10 incorporating an embodiment of the invention are shown. Accordingly, operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

Figure 3:
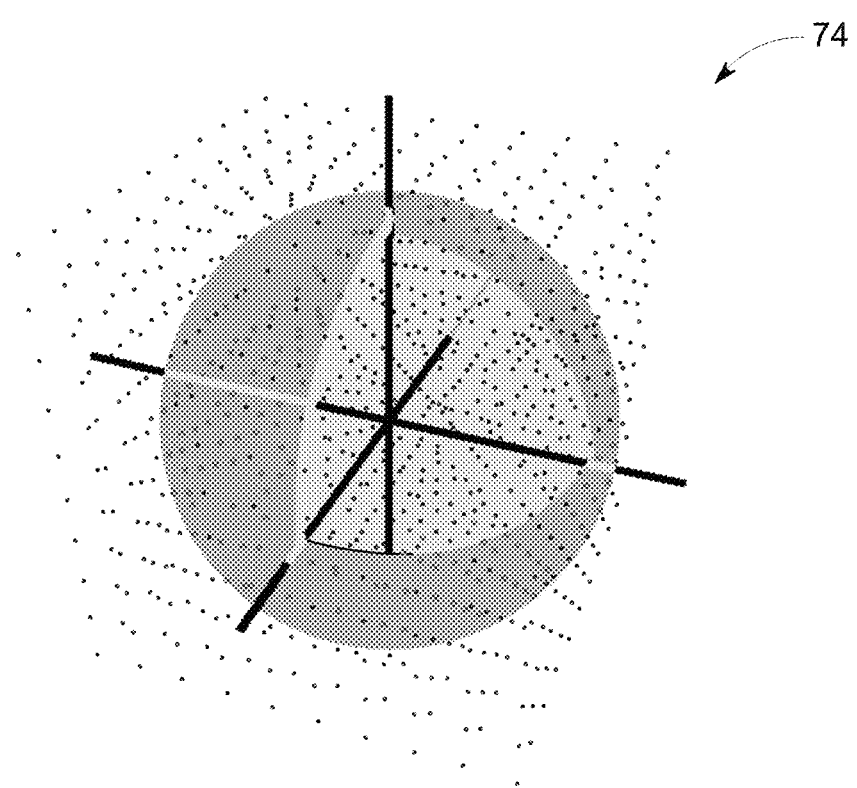
FIG. 3 is a diagram of a k-space acquired by the magnetic resonance imaging system of FIG. 1, in accordance with an embodiment of the present invention.

The MR signals picked up by the RF coil 62 are digitized by the transceiver module 68 and transferred to a memory module 72 in the system control 32. A scan is complete when an array of raw K-Space data 74 (FIG. 3) has been acquired in the memory module 72. This raw K-Space data/datum is rearranged into separate K-Space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26, conveyed to the operator console 12, and presented on the display 18.

Figure 2:
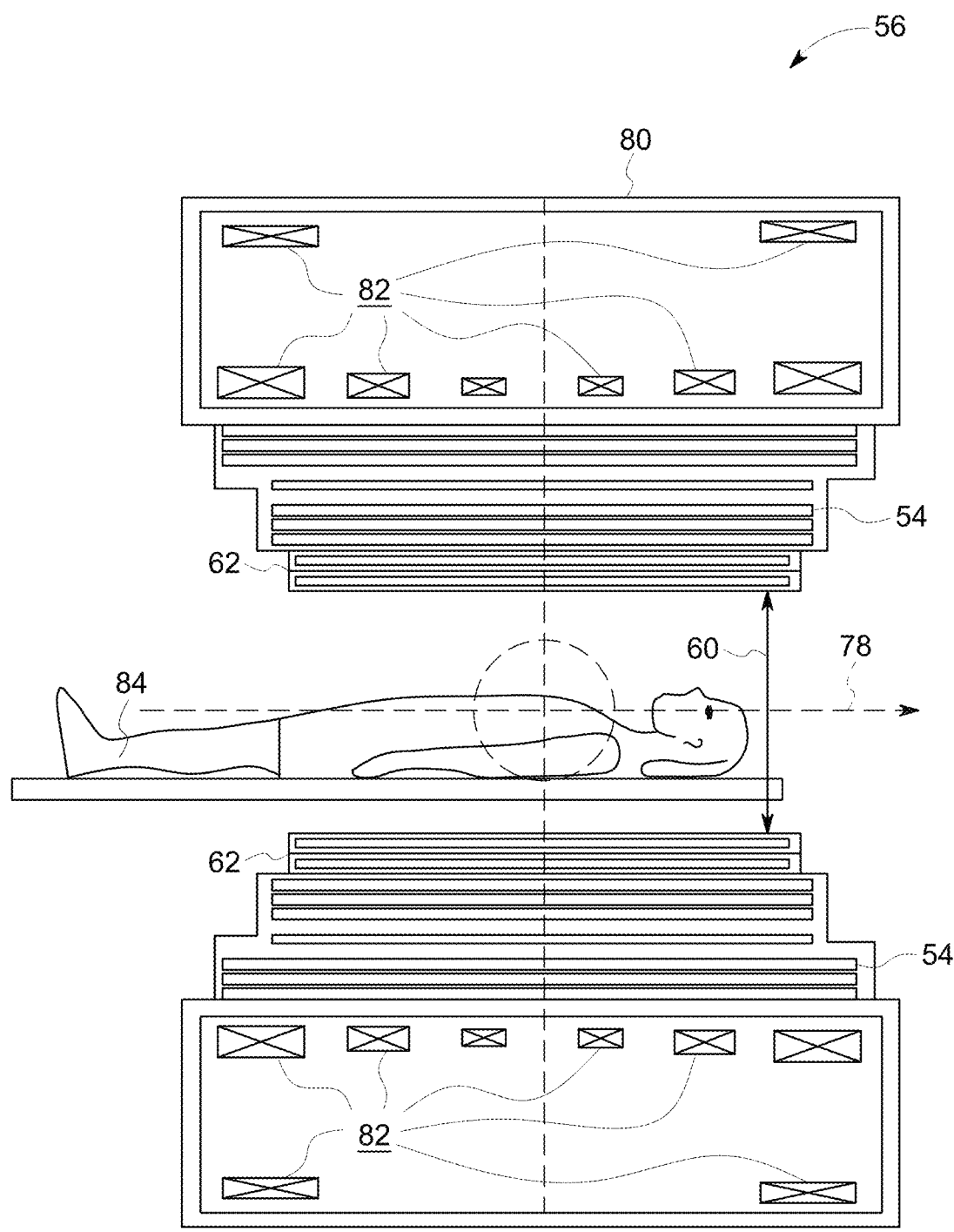
FIG. 2 is a schematic cross-sectional diagram of a magnet assembly of the magnetic resonance imaging system of FIG. 1, in accordance with an embodiment of the present invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58 (FIG. 1). The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 4:
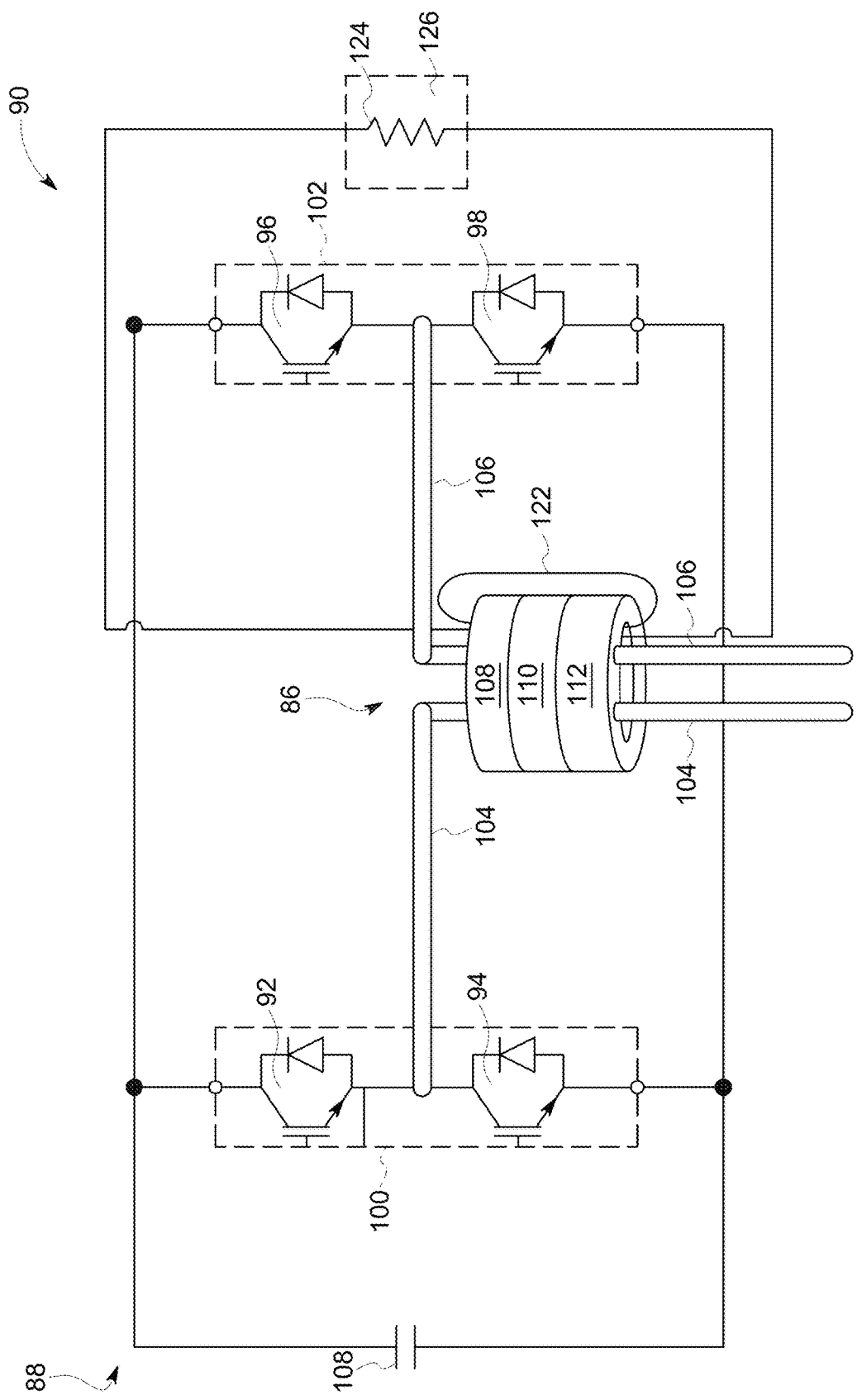
FIG. 4 is an electrical diagram of the system for removing energy from an electrical choke included in the magnetic resonance imaging system of FIG. 1, in accordance with an embodiment of the present invention.

Turning to FIG. 4, an electrical choke 86 that forms part of an h-bridge 88 of at least one of the gradient amplifiers 46 (FIG. 1) is shown along with a system 90 for removing energy from the choke 86. As will be appreciated, the h-bridge 88 includes a switching topology defined by one or more switches 92, 94, 96, 98, e.g., MOSFETs and/or IGBTs, which in embodiments, may be grouped into one or more modules 100, 102 each eclectically connected to common mode bus bars 104 and 106 that pass through the choke 86. The modules 100, 102 may be further electrically connected in parallel to a power source/capacitor 108. The switches 92, 94, 96, 98 may be mounted to grounded heatsinks so as to create a capacitance from the power terminals to ground. The capacitance, in turn, causes common mode currents to flow as a result of switch 92, 94, 96, 98 activation.

The choke 86 may include one or more cores 108, 110, 112 which are operative to generate magnetic energy from the common mode current flowing through the buss bars 104, 106, i.e., the cores 108, 110, 112 generate a magnetic field which stores energy from the common mode current flowing through the bus bars 104, 106.

Figure 5:
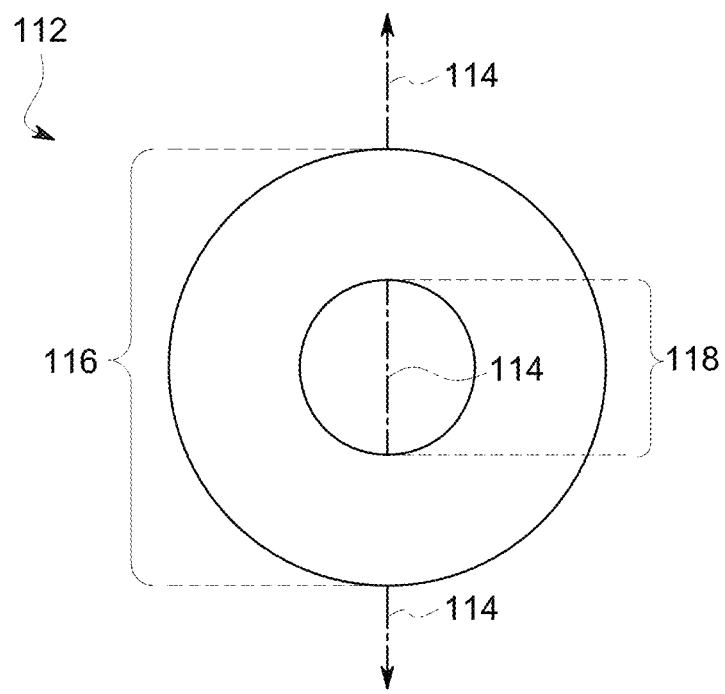
FIG. 5 is a diagram depicting a surface of a core of the system of FIG. 4, in accordance with an embodiment of the present invention.
Figure 6:
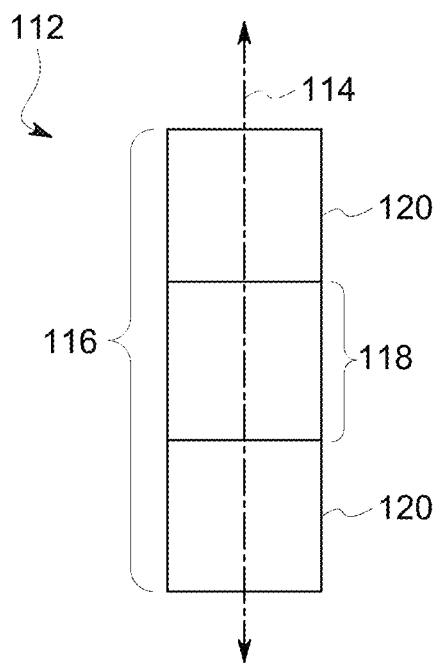
FIG. 6 is a diagram depicting a cross-sectional area of the core of FIG. 5, in accordance with an embodiment of the present invention.

Turning briefly to FIGS. 5 and 6, a frontal view (FIG. 5) and a cross-sectional view (FIG. 6), taken along axis 114 in FIG. 5, of one of the cores 112 is shown. As will be appreciated, while FIGS. 5 and 6 depict a single core 112, it will be understood that the other cores 108 and 110 are similar in shape and/or function as core 112. Accordingly, each core 112 may have a substantially cylindrical shape with an outer diameter 116, an inner diameter 118, and a cross-sectional area 120 (FIG. 6). As best seen in FIG. 4, the bus bars 102 and 106 run through the cores 108, 110, 112 within the inner diameter 118 (FIG. 6). As will be appreciated, the cores 108, 110, 112 may have other shapes to include, rectangular, triangular, or any other shape capable of generating a magnetic field/energy from the common mode current flowing through the bus bars 104, 106 (FIG. 4).

Returning back to FIG. 4, the system 90 includes the cores 108, 110, 112, one or more inductive couplings 122, and a resistor 124 electrically connected to the inductive couplings 122. The inductive couplings 122 are operative to convert the magnetic energy generated by the cores 108, 110, 112 into electrical energy which flows to the resistor 124, which in turn, is operative to dissipate the electrical energy at heat.

In embodiments, the one or more inductive couplings 122 may be conductive wires that run through the inner diameters 118 (best seen in FIGS. 5 and 6) of the cores 108, 110, 112, e.g., the inductive couplings 122 may be windings that pass through all of the cores 108, 110, 112. As will be appreciated, the number of windings and/or inductive couplings 122, i.e., the number of wires forming windings, may be varied. For example, embodiments of the system 90 may have from about 1 to about 10 turns. In embodiments, the inductive couplings 122 may be made of copper and/or any other material suitable for converting magnetic energy into electrical energy/current and for transporting the electrical energy to the resistor 124. In embodiments, the inductive couplings 122 may be formed from about twelve (12) to about twenty-six (26) AWG or equivalent round, flat or litz wire. While the figures herein depict the inductive couplings 122 as windings passing through the inner diameters 118 of the cores 108, 110, 112, it will be understood that the inductive couplings 122 may take any form capable of converting the magnetic energy generated by the cores 108, 110, 112 into electrical energy.

The resistor 124 may be a heat coil and/or any other type of device capable of converting/dissipating electrical energy as heat. For example, in embodiments, the resistor 124 may be wire-wound, film, ceramic, surface mount, thru hole, coldplate mountable, etc. In embodiments, the resistor 124 may be cooled via a gas, solid, and/or liquid coolant 126, e.g., air, forced air, water, liquid nitrogen, ice, dry ice, etc. As will also be appreciated, the resistor 124 may be used to tune the impedance of the choke 86, i.e., varying the resistance of the resistor 124 may vary the impedance of the choke 86. In such embodiments, the resistor 124 may be a variable resistor controllable either manually or via a controller, e.g., the MRI controller 36 (FIG. 1).

Figure 7:
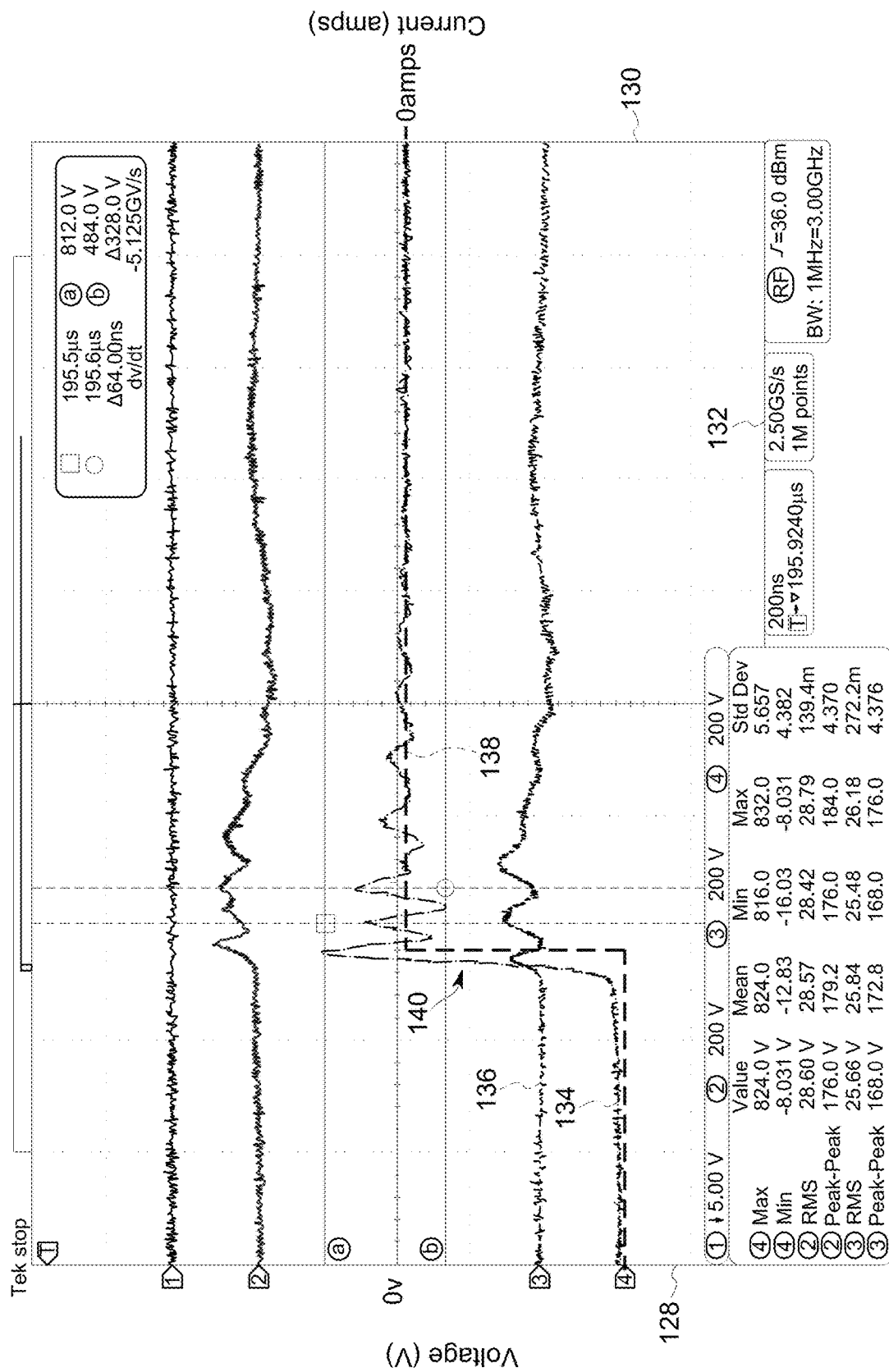
FIG. 7 is a chart depicting output wave forms of an h-bridge that incorporates the system of FIG. 4, in accordance with an embodiment of the present invention.

Illustrated in FIG. 7 is a chart depicting an output wave form of the h-bridge 88 (FIG. 4) incorporating the system 90 (FIG. 4). As will be understood, axes 128, 130, and 132 represent voltage (v), current (amps), and time (ns), respectively, with lines 134, 136, and 138, representing the measured voltage, current, and ideal square wave, respectively. As can be seen in FIG. 7, embodiments of the system 90 provide for a significant reduction in "ringing" in both voltage 134 and current 136 after a state change, e.g., the edge of the square wave 138 generally represented by arrow 140.

Figure 8:
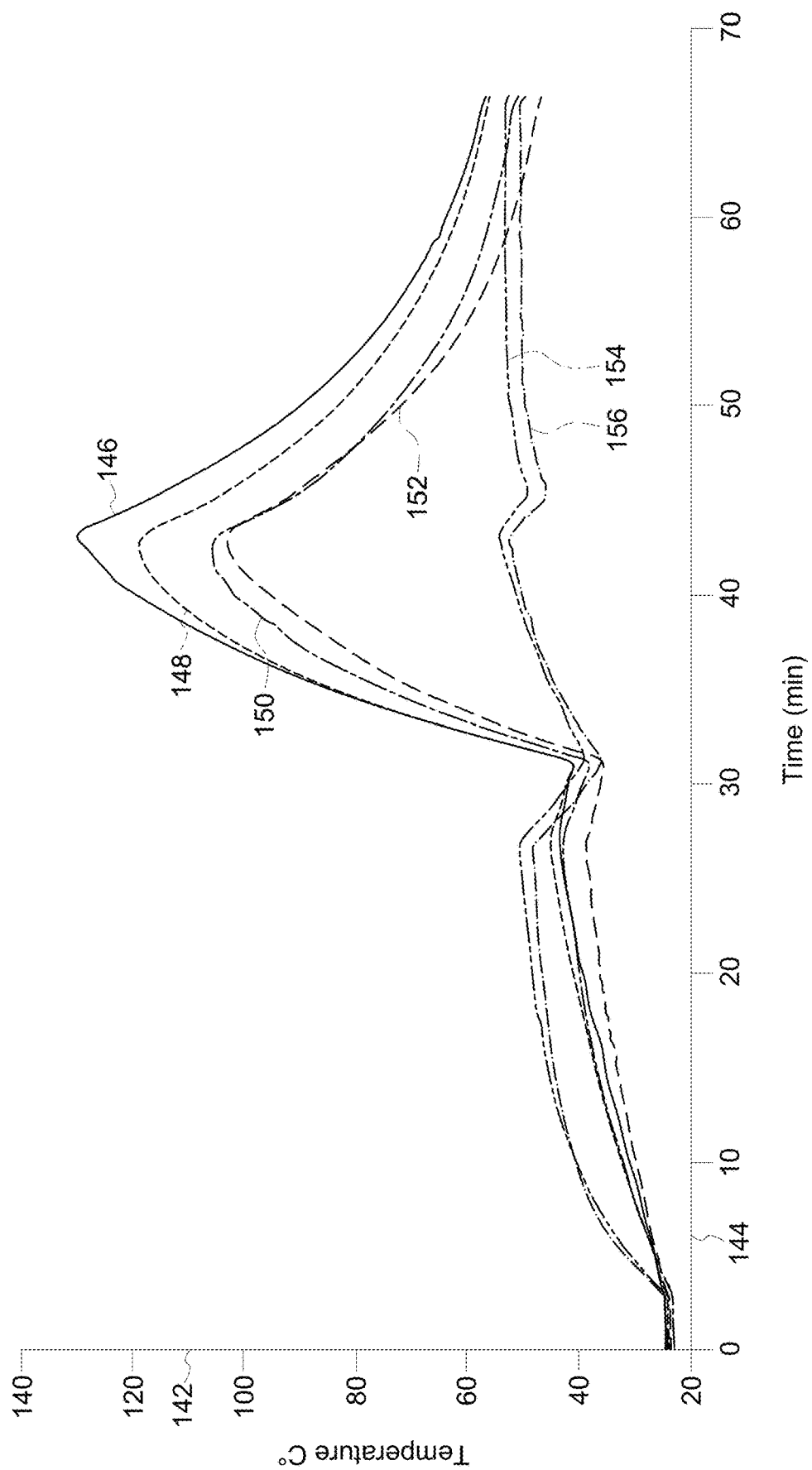
FIG. 8 is a chart depicting temperatures of one or more cores of the system in FIG. 4 over time, in accordance with an embodiment of the present invention.

Moving to FIG. 8, a chart depicting the temperatures of the cores 108, 110, 112 (FIG. 4) of four different h-bridges 88 (FIG. 4) within the gradient amplifiers 46 (FIG. 1) over time, in accordance with an embodiment of the present invention, is shown. Specifically, axes 142 and 144 represent temperature in C.° and time in minutes, respectively; with lines 146, 148, 150, and 152 respectively representing the temperature of the cores in different h-bridges of the gradient amplifiers 46 (FIG. 1); and with lines 154 and 156 representing the temperatures of the bus bars 104, 106 (FIG. 4) of the h-bridge corresponding to line 146. As can be seen between t=0 min to t=30 min, when the system 90 (FIG. 4) is activate/in place, the temperatures of the cores 146, 148, 150, 152 stay below 60 C.°; when the system 90 is deactivate/removed between t=30 min and t=42 min, the temperatures of the cores 146, 148, 150, 152 spike to over 100 C.°; and when the system 90 is reactivated/put back into place between t=42 min to t>=75 min, the temperatures of the cores 146, 148, 150, 152 return back to below 60 C.°.

As will be appreciated, by removing energy from an electrical choke 86 (FIG. 4), embodiments of the system 90 provide for the size of the cores 108, 110, 112 to be reduced. For example, embodiments of the system 90 may provide for the cores 108, 110, 112 to have outer diameters 116 (FIGS. 5 and 6) less than or equal to about 1.5 inches, and/or cross-sectional areas 120 less than or equal to about 0.15 inches$^2$. Additionally, due to the lower temperatures within the cores 108, 110, 112, the cores 108, 110, 112 themselves, which are traditionally made from ferrite, may be made from materials that were previously impractical due to the risk of overheating. For example, in embodiments, the cores 108, 110, 112 may be made from.

Figure 9:
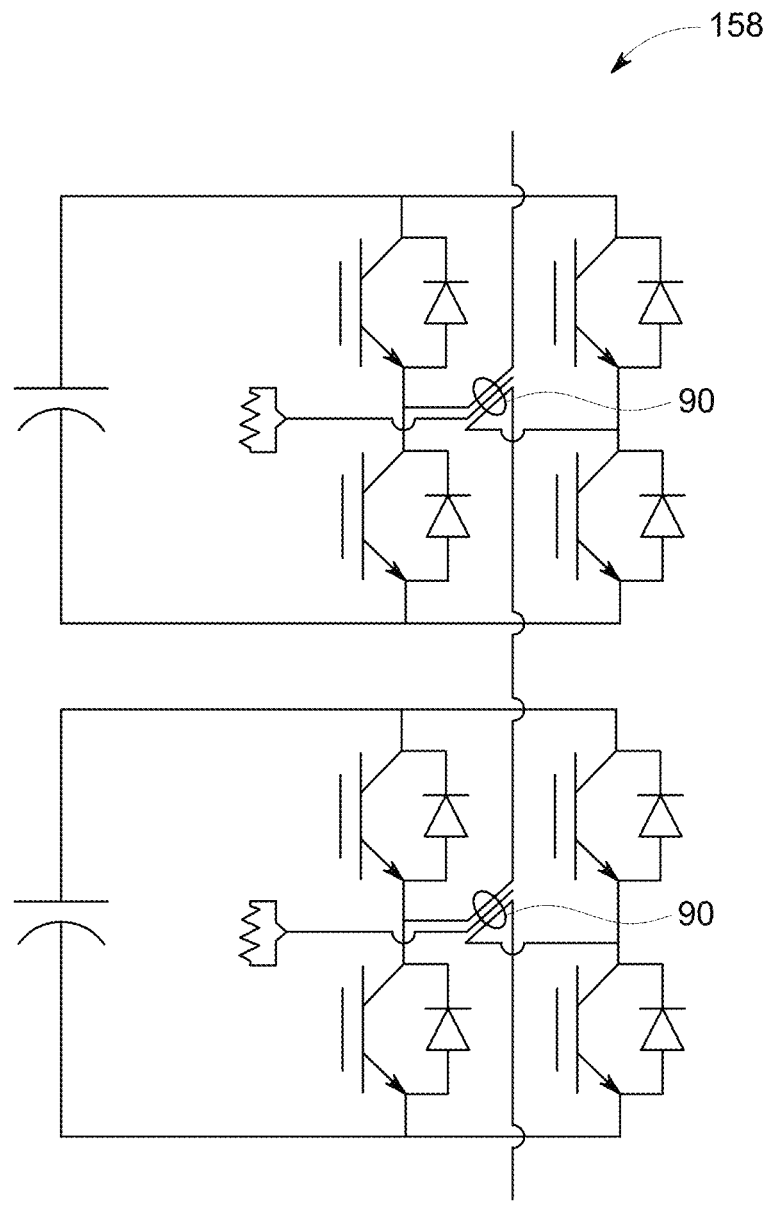
FIG. 9 is a diagram of a multi-level converter that incorporates the system for removing energy from an electrical choke of FIG. 1, in accordance with an embodiment of the present invention.

Additionally, embodiments of the system 90 may be incorporated into a multi-level converter 158 as shown in FIG. 9. While the multi-level converter 158 is depicted herein as a two (2) level converter, it is to be understood that embodiments of the invention may be incorporated into multi-level converters having N number of h-bridges, e.g., four (4).

Finally, it is also to be understood that the systems 10 and/or 90 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the systems 10 and/or 90 may include at least one processor and system memory/data storage structures, which may include random access memory (RAM) and read-only memory (ROM). The at least one processor of the systems 10 and/or 90 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium", as used herein, refers to any medium that provides or participates in providing instructions to the at least one processor of the systems 10 and/or 90 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a system for removing energy from an electrical choke is provided. The system includes one or more cores, at least one inductive coupling, and a resistor. The one or more cores are configured to form part of the electrical choke by generating magnetic energy. The at least one inductive coupling is operative to convert the magnetic energy into electrical energy. The resistor is electrically connected to the at least one inductive coupling and operative to dissipate the electrical energy as heat. In certain embodiments, at least one of the cores has an outer diameter less than or equal to about 1.5 inches. In certain embodiments, at least one of the cores has a cross-sectional area less than or equal to about 0.15 inches$^2$. In certain embodiments, the one or more cores include ferrite. In certain embodiments, the resistor is operative to tune the impedance of the choke. In certain embodiments, the resistor is cooled via at least on of air and liquid coolant. In certain embodiments, the electrical choke is disposed in an h-bridge. In certain embodiments, the electrical choke is disposed within a gradient amplifier.

Yet other embodiments provide for an electrical choke. The electrical choke includes one or more cores, at least one inductive coupling, and a resistor. The one or more cores are operative to generate magnetic energy. The at least one inductive coupling is operative to convert the magnetic energy into electrical energy. The resistor is electrically connected to the at least one inductive coupling and operative to dissipate the electrical energy as heat. In certain embodiments, at least one of the cores has an outer diameter less than or equal to about 1.5 inches. In certain embodiments, at least one of the cores has a cross-sectional area less than or equal to about 0.15 inches$^2$. In certain embodiments, the one or more cores includes ferrite. In certain embodiments, the resistor is operative to tune the impedance of the choke. In certain embodiments, the resistor is cooled via at least one of air and a liquid coolant.

Yet still other embodiments provide for a method for removing energy from an electrical choke. The method includes generating magnetic energy via one or more cores of the choke; converting the magnetic energy into electrical energy via at least one inductive coupling; and dissipating the electrical energy as heat via a resistor electrically connected to the at least one inductive coupling. In certain embodiments, the method further includes tuning an impedance of the choke via the resistor. In certain embodiments, the method further includes cooling the resistor via at least one of air and a liquid coolant. In certain embodiments, the method further includes scanning an object with a magnetic resonance imaging system that includes the electrical choke in a gradient amplifier. In certain embodiments, at least one of the cores has an outer diameter less than or equal to about 1.5 inches. In certain embodiments, the one or more cores includes ferrite.

Accordingly, by removing heat from the cores of an electrical choke, some embodiments of the present invention may provide for a reduction in size of the cores of the choke. As will be appreciated, reducing the size of the cores, in turn, may reduce the size of the choke, thus making for smaller and more efficient chokes. Reducing the size of the choke may, in some embodiments, reduces the overall amount of electric wiring, which in turn, may reduce the amount of electromagnetic radiation interference ("EMI") emitted by the choke, as compared to traditional chokes. Thus, some embodiments of the present invention may provide for increased switching frequencies and/or edge rates in electronic topologies, as compared to traditional chokes.

Additionally, and as discussed above, by removing heat from the cores of an electrical choke, some embodiments of the present invention enable previously impractical materials to be used in the cores of electrical chokes. As will be appreciated, some of these materials are significantly less expensive and/or more abundant than traditional ferrite.

Further, placement of the resistor at a distance from the cores, e.g., near a fan, in some embodiments, allows use of forced air, coldplates, and/or heatsinks for cooling/dissipating the energy, and/or frees up space near the cores for the inclusion of a coldplate near the cores. Additionally, some embodiments of the present invention require less space for the cores, as compared to traditional chokes, which in turn, may make chokes, in accordance with embodiments of the present invention, practical for use in previously impractical applications.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A system for removing energy from an electrical choke comprising:
   one or more cores configured to form part of the electrical choke by generating magnetic energy;
   at least one inductive coupling operative to convert the magnetic energy into electrical energy; and
   a resistor electrically connected to the at least one inductive coupling and operative to dissipate the electrical energy as heat.

2. The system of claim 1, wherein at least one of the cores has an outer diameter less than or equal to about 1.5 inches.

3. The system of claim 1, wherein at least one of the cores has a cross-sectional area less than or equal to about 0.15 inches$^2$.

4. The system of claim 1, wherein the one or more cores comprises of ferrite.

5. The system of claim 1, wherein the resistor is operative to tune the impedance of the choke.

6. The system of claim 1, wherein the resistor is cooled via at least one of air and liquid coolant.

7. The system of claim 1, wherein the electrical choke is disposed in an h-bridge.

8. The system of claim 1, wherein the electrical choke is disposed within a gradient amplifier.

9. An electrical choke comprising:
   one or more cores operative to generate magnetic energy;
   at least one inductive coupling operative to convert the magnetic energy into electrical energy; and
   a resistor electrically connected to the at least one inductive coupling and operative to dissipate the electrical energy as heat.

10. The electrical choke of claim 9, wherein at least one of the cores has an outer diameter less than or equal to about 1.5 inches.

11. The electrical choke of claim 9, wherein at least one of the cores has a cross-sectional area less than or equal to about 0.15 inches$^2$.

12. The electrical choke of claim 9, wherein the one or more cores comprises of ferrite.

13. The electrical choke of claim 9, wherein the resistor is operative to tune the impedance of the choke.

14. The electrical choke of claim 9, wherein the resistor is cooled via at least one of air and liquid coolant.

15. A method for removing energy from an electrical choke comprising:
   generating magnetic energy via one or more cores of the choke;
   converting the magnetic energy into electrical energy via at least one inductive coupling; and
   dissipating the electrical energy as heat via a resistor electrically connected to the at least one inductive coupling.

16. The method of claim 15 further comprising:
   tuning an impedance of the choke via the resistor.

17. The method of claim 15 further comprising:
   cooling the resistor via at least one of air and liquid coolant.

18. The method of claim 15 further comprising:
   scanning an object with a magnetic resonance imaging system that includes the electrical choke in a gradient amplifier.

19. The method of claim 15, wherein at least one of the cores has an outer diameter less than or equal to about 1.5 inches.

20. The method of claim 15, wherein the one or more cores comprises of ferrite.

* * * * *